(12) United States Patent
Lee

(10) Patent No.: US 6,801,066 B2
(45) Date of Patent: Oct. 5, 2004

(54) APPARATUS FOR GENERATING QUADRATURE PHASE SIGNALS AND DATA RECOVERY CIRCUIT USING THE SAME

(75) Inventor: Jiunn-Yih Lee, Hsinchu (TW)

(73) Assignee: MStar Semiconductor, Inc. (TW)

( * ) Notice: Subject to any disclaimer, the term of this patent is extended or adjusted under 35 U.S.C. 154(b) by 0 days.

(21) Appl. No.: 10/647,476

(22) Filed: Aug. 26, 2003

(65) Prior Publication Data

US 2004/0071227 A1 Apr. 15, 2004

Related U.S. Application Data

(60) Provisional application No. 60/417,180, filed on Oct. 10, 2002.

(51) Int. Cl.[7] ............................................. H03B 19/00
(52) U.S. Cl. .................. 327/119; 327/120; 327/258
(58) Field of Search ............................... 341/143, 118; 327/258, 239, 255, 256, 257, 259, 119, 120

(56) References Cited

U.S. PATENT DOCUMENTS

| | | | | |
|---|---|---|---|---|
| 5,554,945 A | * | 9/1996 | Lee et al. ................... | 327/105 |
| 6,122,336 A | * | 9/2000 | Anderson ................... | 375/371 |
| 6,564,359 B2 | * | 5/2003 | Saeki .......................... | 716/5 |
| 6,570,944 B2 | * | 5/2003 | Best et al. .................. | 375/355 |

* cited by examiner

Primary Examiner—Brian Young
Assistant Examiner—John B Nguyen
(74) Attorney, Agent, or Firm—Michael D. Bednarek; Shaw Pittman LLP

(57) ABSTRACT

An apparatus for generating quadrature phase signals in a half-rate data recovery circuit, which is adapted to generate a first and a second clock signals having the same frequency and being 90 degrees out of phase with each other. The apparatus for generating quadrature phase signals mainly comprises a base selector, a first phase interpolator and a second phase interpolator. The base selector generates, based on a region control signal, a pair of phase region boundaries for the first clock signal as well as a pair of phase region boundaries for the second clock signal by using a plurality of reference clock signals. The first and second phase interpolators perform, based on a position control signal, weighted average processes for the two pairs of phase region boundaries, respectively, to thereby obtain the first and the second clock signals.

14 Claims, 8 Drawing Sheets

| Phase of CKI | CKI | CKQ |
|---|---|---|
| Region A | 0~45 | 270~315 |
| Region B | 45~90 | 315~0 |
| Region C | 90~135 | 0~45 |
| Region D | 135~180 | 45~90 |
| Region E | 180~225 | 90~135 |
| Region F | 225~270 | 135~180 |
| Region G | 270~315 | 180~225 |
| Region H | 315~0 | 225~270 |

| Phase of CKI | CA | CB | CC | CD | CE | CF | M1 | M2 | M3 | M4 | B1 | B2 | B3 | B4 |
|---|---|---|---|---|---|---|---|---|---|---|---|---|---|---|
| Region A | 0 | 0 | 1 | 1 | 0 | 0 | 0 | 45 | 270 | 315 | 0 | 45 | 270 | 315 |
| Region B | 0 | 0 | 0 | 1 | 1 | 0 | 0 | 45 | 90 | 315 | 90 | 45 | 0 | 315 |
| Region C | 0 | 0 | 0 | 0 | 1 | 1 | 0 | 45 | 90 | 135 | 90 | 135 | 0 | 45 |
| Region D | 1 | 0 | 0 | 0 | 0 | 1 | 180 | 45 | 90 | 135 | 180 | 135 | 90 | 45 |
| Region E | 1 | 1 | 0 | 0 | 1 | 0 | 180 | 225 | 90 | 135 | 180 | 225 | 90 | 135 |
| Region F | 1 | 1 | 1 | 0 | 1 | 1 | 180 | 225 | 270 | 135 | 270 | 225 | 180 | 135 |
| Region G | 1 | 1 | 1 | 1 | 0 | 1 | 180 | 225 | 270 | 315 | 270 | 315 | 180 | 225 |
| Region H | 0 | 1 | 1 | 1 | 0 | 1 | 0 | 225 | 270 | 315 | 0 | 315 | 270 | 225 |

Figure 7

| Phase of CKI | CA | CB | CC | CD | CE | CF | Weight | B1 | B2 |
|---|---|---|---|---|---|---|---|---|---|
| 45A | 0 | 0 | 1 | 1 | 0 | 0 | 0 | 0 | 45 |
| Region A | 0 | 0 | 1 | 1 | 0 | 0 | 0.25 | 0 | 45 |
| Region A | 0 | 0 | 1 | 1 | 0 | 0 | 0.5 | 0 | 45 |
| Region A | 0 | 0 | 1 | 1 | 0 | 0 | 0.75 | 0 | 45 |
| 0A | 0 | 1 | 1 | 1 | 0 | 0 | 1 | 0 | 45 |
| 0H | 0 | 1 | 1 | 1 | 0 | 1 | 1 | 0 | 315 |
| Region H | 0 | 1 | 1 | 1 | 0 | 1 | 0.75 | 0 | 315 |
| Region H | 0 | 1 | 1 | 1 | 0 | 1 | 0.5 | 0 | 315 |
| Region H | 0 | 1 | 1 | 1 | 0 | 1 | 0.25 | 0 | 315 |
| 315H | 0 | 1 | 1 | 1 | 0 | 1 | 0 | 0 | 315 |

Figure 10

APPARATUS FOR GENERATING QUADRATURE PHASE SIGNALS AND DATA RECOVERY CIRCUIT USING THE SAME

CROSS-REFERENCE TO RELATED APPLICATIONS

This application is based upon and claims the benefit of U.S. provisional application Ser. No. 60/417,180 filed Oct. 10, 2002, the contents of which are incorporated herein by reference.

BACKGROUND OF THE INVENTION

1. Field of the Invention

This invention relates to a data recovery circuit, and more particularly to a controllable quadrature phase generator in a half-rate data recovery circuit for generating two clock signals that are 90 degrees out of phase with each other.

2. Description of the Related Art

In digital data processing, all digital data is clocked by an associated clock signal, the period of which is equal to that of the digital data, so that a digital circuit is allowed to process digital data and to function properly. When digital data is transmitted serially, the associated clock signal is not transmitted along with the digital data for the consideration of transmission efficiency. Therefore, the receiving end must be able to extract clock signal from the incoming data so that the received data can be correctly recovered. Phase locked loop (PLL) circuits are generally used in circuits for data recovery. FIG. 1 shows a schematic block diagram of a conventional data recovery circuit. As shown, a data recovery circuit 10 mainly comprises a clock source 12, a phase detector 14 and a loop filter 16. The clock source 12 is for example a voltage-controlled oscillator for generating a reference clock signal CLK having the same frequency as the incoming data signal. The phase detector 14 compares the phase of the incoming data signal to the phase of the reference clock signal CLK, determining whether or not these two signals are synchronous with each other. If the incoming data signal leads or lags the reference clock signal CLK, then the phase detector 14 generates a phase error signal which is a function of the phase difference between these two signals. The phase error signal is then applied to the loop filter 16 so as to eliminate the undesired high frequency noise and to output a control signal for feedback to the clock source 12. The clock source 12 is controlled based on the control signal to adjust the phase of the reference clock signal CLK. In this way, the reference clock signal CLK can be synchronized with the incoming data signal and thus may be used for retiming the incoming data signal to thereby produce the correctly recovered data.

Recently, the demand for higher transmission speed has been rapidly increasing. However, the maximum data rate allowed by the phase detector in the above full-rate data recovery circuit is approaching the limit. Therefore, such circuit can hardly satisfy the speed demand in high speed serial communication. A half-rate data recovery circuit has been developed to solve this issue. This half-rate data recovery circuit, which operates at a frequency equal to half the rate of the incoming data stream, approximately doubles the maximum data rate allowed to be processed by the circuit at the receiving end.

SUMMARY OF THE INVENTION

Therefore, an object of the present invention is to provide an apparatus for generating two quadrature clock signals, i.e., two clock signals being 90 degrees out of phase with each other, by using a plurality of reference clock signals. The phase of the generated clock signals can be digitally controlled and adjustable through the whole cycle.

Another object of the present invention is to provide a half-rate data recovery circuit using the above apparatus for generating two quadrature clock signals being 90 degrees out of phase with each other and having a frequency equal to half the incoming data rate.

To achieve the above objects, according to one aspect of the present invention, an apparatus for generating quadrature phase signals comprises a base selector, a first phase interpolator and a second phase interpolator. The base selector generates a first, a second, a third and a fourth base clock signals in accordance with a region control signal by using a plurality of reference clock signals of the same frequency and different phases. The first and the second base clock signals are used as boundaries for defining a phase region for a first clock signal while the third and the fourth base clock signals are used as boundaries for defining a phase region for a second clock signal. The phase difference between the first and the second base clock signals is substantially equal to the phase difference between the third and the fourth base clock signals, and the phase difference between the first and the third base clock signals and the phase difference between the second and the fourth base clock signals are both substantially 90 degrees. The first phase interpolator operates in accordance with a position control signal to generate a first clock signal, the phase of which is a weighted average of the phases of the first and the second base clock signals. Similarly, the second phase interpolator operates in accordance with the same position control signal to generate a second clock signal, the phase of which is a weighted average of the third and the fourth base clock signals. The first and the second clock signals both have the same frequency and are substantially 90 degrees out of phase with each other.

According to another aspect of the present invention, a data recovery circuit is designed to incorporate the above apparatus for generating two quadrature clock signals including a first and a second clock signals having a frequency equal to half the frequency of an incoming data signal received by the data recovery circuit. The clock signals are fed into a phase detector for phase comparison with the incoming data, which in turn generates a phase error signal. A digital loop filter operates on the basis of the phase error signal to digitally control the apparatus for generating two quadrature clock signals, adjusting the phases of the generated clock signals so that the second clock signal is synchronous with the incoming data signal and the first clock signal is always maintained 90 degrees out of phase with the second clock signal.

BRIEF DESCRIPTION OF THE DRAWINGS

Objects and advantages of the present invention will be fully understood from the detailed description to follow taken in conjunction with the embodiments as illustrated in the accompanying drawings, wherein:

FIG. 7 is a table showing the relation among the control bits, the mediate clock signals, and the base clock signals;

FIG. 10 is a table illustrating the relation between the control signal and the phase rotation of the quadrature clock signals.

DETAILED DESCRIPTION OF THE PREFERRED EMBODIMENT

Figure 1:
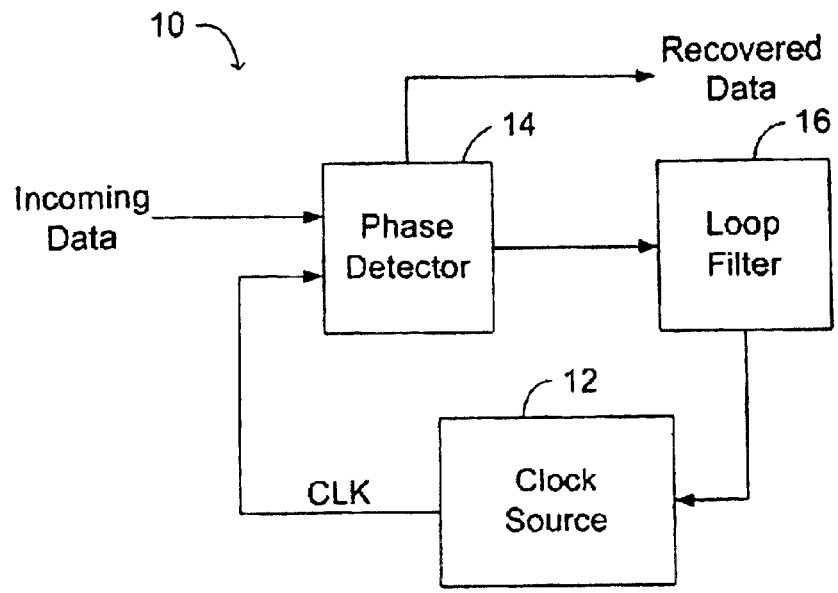
FIG. 1 depicts a schematic block diagram of a conventional data recovery circuit.
Figure 3:
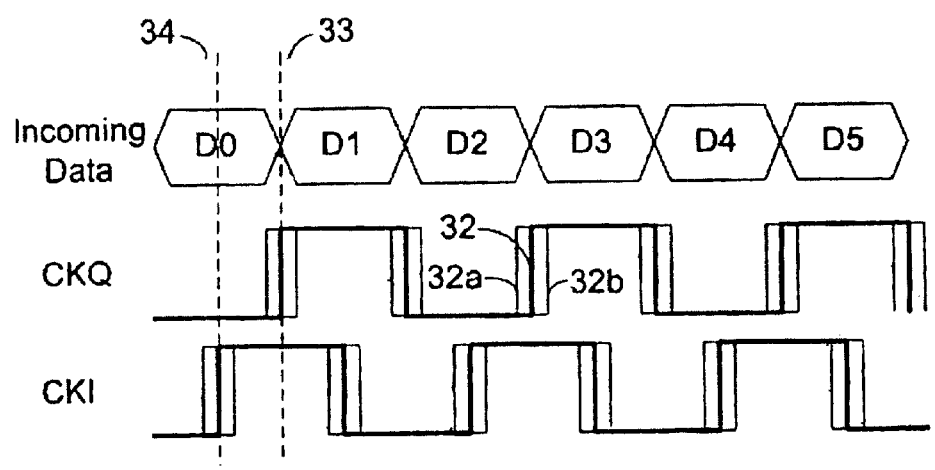
FIG. 3 depicts a timing diagram showing the incoming data signal received by the data recovery circuit and the first and the second clock signals.
Figure 2:
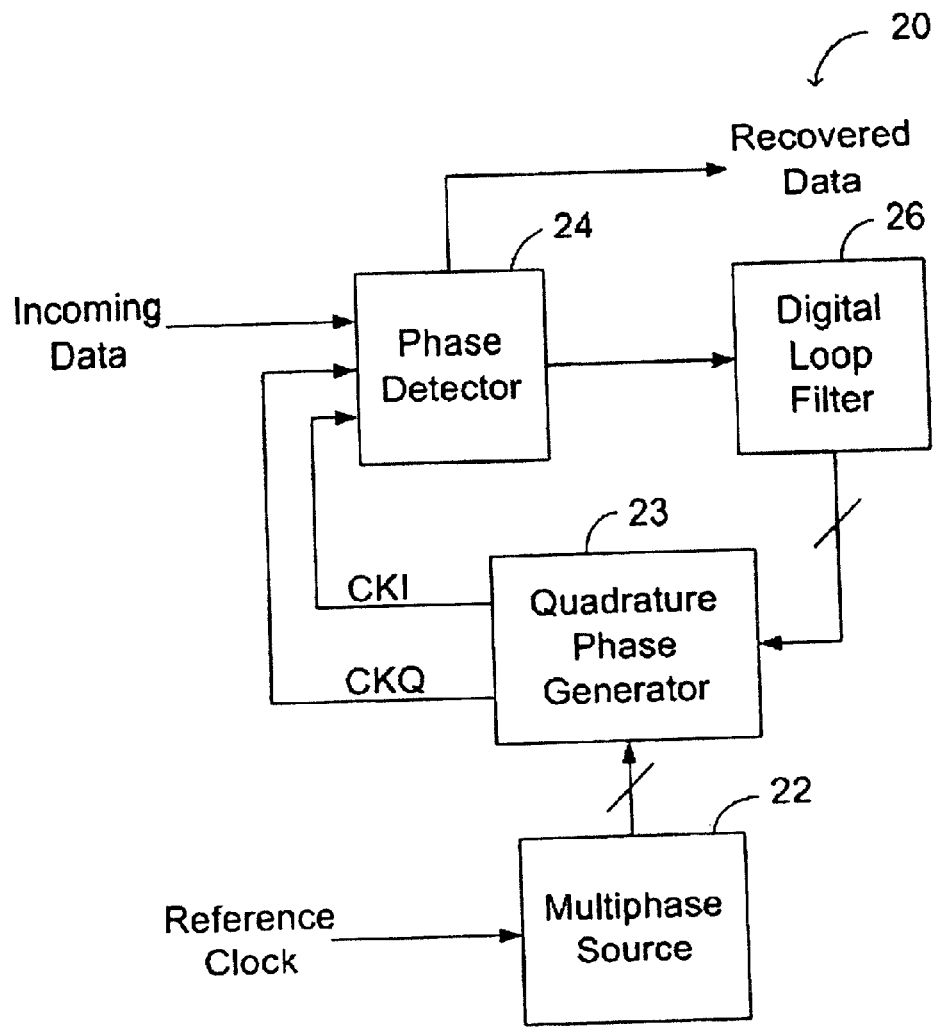
FIG. 2 depicts a schematic block diagram of a half-rate data recovery circuit according to the present invention.

Please refer to FIG. 2, which shows the schematic block diagram of a half-rate data recovery circuit according to the present invention. As shown, the data recovery circuit 20 mainly comprises a multiphase source 22, a quadrature phase generator 23, a phase detector 24 and a digital loop filter 26. The multiphase source 22 generates a plurality of reference clock signals of the same frequency and different phases from an external reference clock. In the preferred embodiment, the multiphase source 22 generates four reference clock signals with phases separated by 45 degrees, i.e., 0-degree, 45-degree, 90-degree and 135-degree, respectively. The quadrature phase generator 23 receives the four reference clock signals from the multiphase source 22 and generates therefrom a first clock signal CKI (in-phase) and a second clock signal CKQ (quadrature) for outputting to the phase detector 24. Please refer now to the timing diagram in FIG. 3. The first and the second clock signals CKI and CKQ are of the same frequency, which is equal to half the frequency of an incoming data signal received by the data recovery circuit 20, and are substantially 90 degrees out of phase with each other. The phase detector 24 compares the incoming data signal and the second clock signal CKQ to determine whether or not a phase difference exists therebetween, that is, to determine whether or not the rising edge/falling edge of the second clock signal CKQ is aligned with the transition portion between two adjacent data bits. In FIG. 3, a rising edge of the clock signal 32 is aligned with the transition portion 33 between two data bits D0 and D1, a rising edge of the clock signal 32a leads the transition portion 33 between two data bits D0 and D1, and a rising edge of the clock signal 32b lags the transition portion 33 between two data bits D0 and D1. If there is no phase difference between the incoming data signal and the second clock signal CKQ, i.e., the rising edge/falling edge of the second clock signal CKQ is aligned with the transition portion between two adjacent data bits, then each rising edge/falling edge of the first clock signal CKI can be maintain in the central portion 34 of each incoming data bit since the first clock signal CKI is offset from the second clock signal CKQ by 90 degrees. In this way, the most correct result can be obtained in data recovery when the first clock signal CKI is employed for sampling the incoming data signal. If there is a phase difference between the incoming data signal and the second clock signal CKQ, for example, in the cases of the clock signals 32a and 32b, the phase detector 24 generates a phase error signal based on the lead/lag conditions. The digital loop filter 26 operates to filter out undesired high frequency noise, as well as to generate a digital control signal on the basis of the phase error signal generated by the phase detector 24. The digital control signal is fed back to the quadrature phase generator 23 to adjust the phases of the first and the second clock signals CKI and CKQ, so that the phase difference between the incoming data signal and the second clock signal CKQ can be minimized. In the preferred embodiment, the digital control signal comprises a region control signal and a position control signal, which will be better described below.

Figure 4:
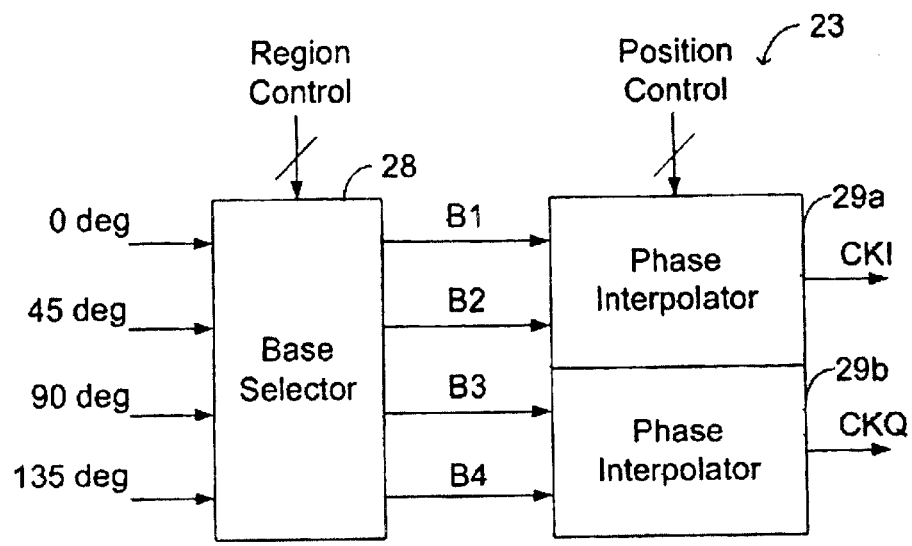
FIG. 4 depicts a schematic block diagram of a preferred embodiment of the quadrature phase generator according to the present invention.

A preferred embodiment of the quadrature phase generator 23 is shown in FIG. 4. The quadrature phase generator 23 comprises a base selector 28, a first phase interpolator 29a and a second phase interpolator 29b.

Figures 5A, 5B:
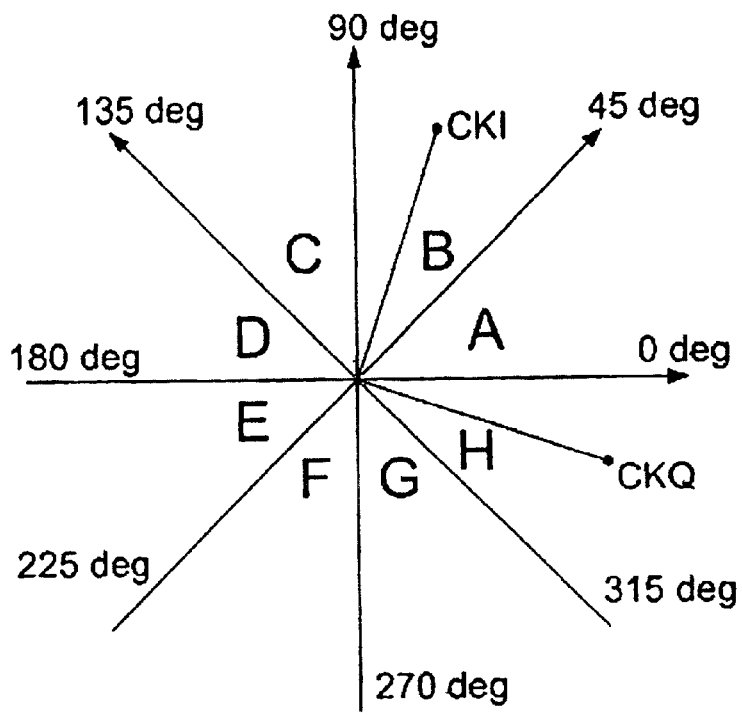
FIGS. 5(a) and 5(b) respectively show a phase diagram and a phase region table for the quadrature phase generator.

The base selector 28 is provided with a control input terminal for receiving the region control signal from the digital loop filter 26, and four reference clock input terminals for receiving the four reference clock signals from the multiphase source 22. These four reference clock signals, i.e., the 0-degree, 45-degree, 90-degree and 135-degree signals, and their inverted signals, i.e., the 180-degree, 225-degree, 270-degree and 315-degree signals, together form eight different phases being evenly spaced apart from one another by 45 degrees to divide the phase plane into eight regions. The base selector 28 selects a first and a second base clock signals B1 and B2 from the four reference clock signals (the 0-degree, 45-degree, 90-degree and 135-degree signals) and their inverted signals (the 180-degree, 225-degree, 270-degree and 315-degree signals) in accordance with the region control signal. The first and the second base clock signals B1 and B2, which are for example separated by 45 degrees, serve as a pair of boundaries for defining the phase region of the first clock signal CKI. The base selector 28 also selects a third and a fourth base clock signals B3 and B4, which are also for example separated by 45 degrees, as a pair of boundaries for defining the phase region of the second clock signal CKQ. Since the first and the second clock signals CKI and CKQ must be 90 degrees out of phase with each other, the first and the third base clock signals B1 and B3 are selected to have phases separated by 90 degrees and the second and the fourth base clock signal B2 and B4 are also selected to have phases separated by 90 degrees. FIGS. 5(a) and 5(b) respectively show a phase diagram and a phase region table for explaining phase region selection of the first and the second clock signals CKI and CKQ. For instance, as shown in FIG. 5(a), when the phase of the first clock signal CKI falls in the region B bounded by two base clock signals having phases of 45-degree and 90-degree respectively, the phase of the second clock signal CKQ falls in the region H bounded by two base clock signals having phases of 0-degree and 315-degree respectively. The discussion here assumes that the first clock signal CKI leads the second clock signal CKQ. However, in practice the first clock signal CKI can also be set to lag the second clock signal CKQ.

Figure 6:
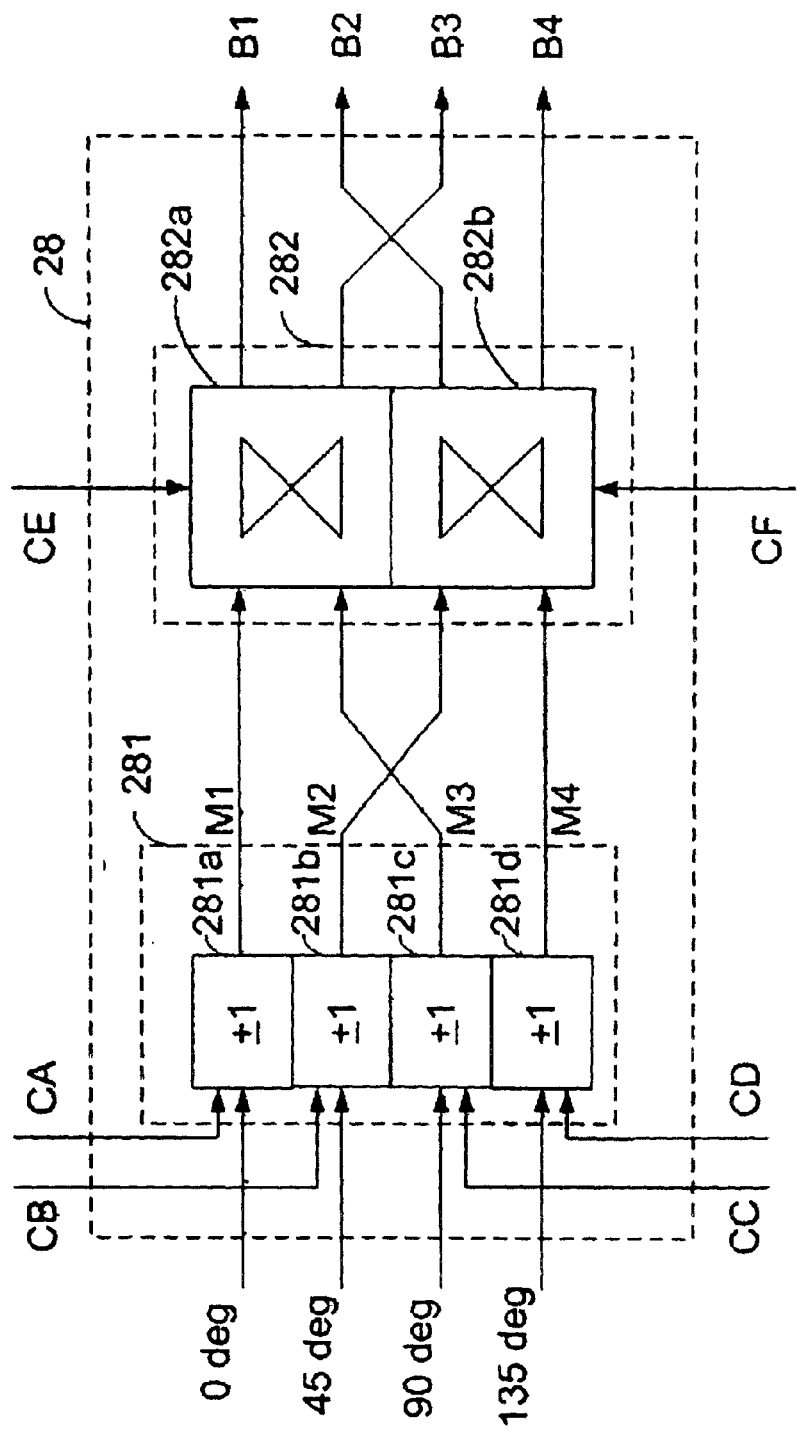
FIG. 6 depicts a circuit for implementing the base selector in the quadrature phase generator.

FIG. 6 illustrates a circuit for implementing the base selector 28. As shown, the base selector 28 includes a buffer/inverter unit 281 and a bypass/cross unit 282 and is controlled by a region control signal having six control bits CA~CF. The buffer/inverter unit 281 consists of, for example, four exclusive-or (XOR) gates 281a~281d. Each of the XOR gates 281a~281d has two input terminals for receiving one of the reference clock signals and one of the control bits CA~CD, respectively, and has an output terminal for outputting one of four mediate clock signals M1~M4. When an XOR gate receives a control bit "0" at one input terminal, the output mediate clock signal will be the same as the reference clock signal at the other input terminal. In this way, the XOR gate acts like a buffer. When an XOR gate receives a control bit "1" at one input terminal, the output mediate clock signal will be the inverted signal of the reference clock signal at the other input terminal. In this way, the XOR gate acts like an inverter. Thereby, the buffer/inverter unit 281 is able to selectively output four mediate clock signals, the phases of which are 0-degree/ 180-degree, 45-degree/225-degree, 90-degree/270-degree and 135-degree 315-degree, respectively. The bypass/cross unit 282 consists of a first bypass/cross multiplexer 282*a* and a second bypass/cross multiplexer 282*b*, each of which is provided with two input terminals and two output terminals and is respectively controlled by a control bit CE or CF. Each of the first and the second bypass/cross multiplexers 282*a* and 282*b* operates to direct-connect signals at its two input terminals to its two output terminals upon receiving a control bit "0" and to cross-connect signals at its two input terminals to its two output terminals upon receiving a control bit "1". In this embodiment, the first bypass/cross multiplexer 282*a* receives at its two input terminals the first and the third mediate clock signals M1 and M3 generated by the buffer/inverter unit 281, and outputs at its two output terminals two output signals to serve as the first and the third base clock signals B1 and B3, respectively. That is, the first bypass/cross multiplexer 282*a* outputs a 0-degree/180-degree signal and a 90-degree/270-degree signal respectively as the first base clock signal B1 and as the third base clock signal B3. Similarly, the second bypass/cross multiplexer 282*b* receives at its the two input terminals the second and the fourth mediate clock signals M2 and M4 generated by the buffer/inverter unit 281, and outputs at its two output terminals two output signals to serve as the second and the fourth base clock signals B2 and B4, respectively. Therefore, the second bypass/cross multiplexer 282*b* outputs a 45-degree/225-degree degrees signal and a 135-degree/315-degree signal respectively as the second base clock signal B2 and as the fourth base clock signal B4. The table in FIG. 7 shows the relation among the control bits CA~CF, the mediate clock signals M1~M4 and the base clock signals B1~B4.

Referring back to FIG. 4, the first and the second base clock signals B1 and B2, i.e., the boundaries for defining the phase region of the first clock signal CKI, selected by the base selector 28 are subsequently fed into the first phase interpolator 29*a* to generate the first clock signal CKI by a weighted average process. Similarly, the third and the fourth base clock signals B3 and B4, i.e., the boundaries for defining the phase region of the second clock signal CKQ selected by the base selector 28 are subsequently fed into the second phase interpolator 29*b* to generate the second clock signal CKQ by a weighted average process. The weighted average process is carried out by the first or the second phase interpolator 29*a* or 29*b* to obtain a weighted average of two boundary phases, based on a "weight" given by the position control signal from the digital loop filter 26.

Figure 8:
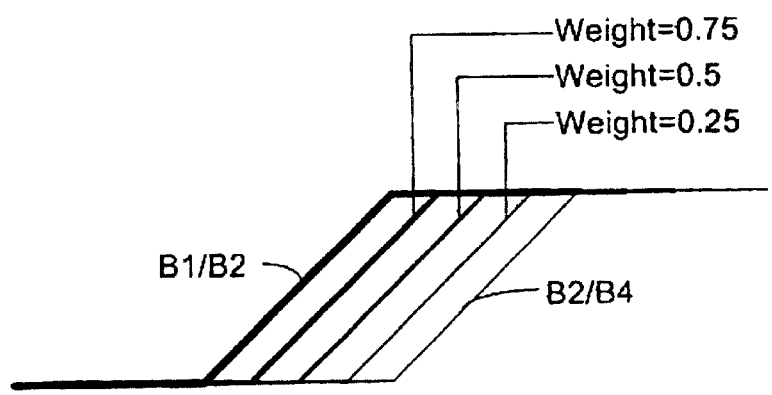
FIG. 8 illustrates the relation between the weight represented by the position control signal and the clock signal generated by the weighted average process.

More specifically, the first clock signal CKI generated at the output terminal of the first phase interpolator 29*a* has a phase which is a weighted average of the phases of the first and the second base clock signals B1 and B2. That is, the phase of the first clock signal CKI=(weight)×(the phase of the first base clock signal B1)+(1-weight)×(the phase of the second base clock signal B2). Similarly, the second clock signal CKQ generated at the output terminal of the second phase interpolator 29*b* has a phase which is a weighted average of the phases of the third and the fourth base clock signals B3 and B4. That is, the phase of the second clock signal CKQ=(weight)×(the phase of the third base clock signal B3)+(1-weight)×(the phase of the fourth base clock signal B4). As discussed above, the phases of the first and the third base clock signals B1 and B3 are selected to be separated by 90 degrees and the second and the fourth base clock signals B2 and B4 are also selected to be separated by 90 degrees. Therefore, by controlling weighted average processes in the first and the second phase interpolators 29*a* and 29*b* at the same weight, two clock signals CKI and CKQ having a phase difference of 90 degrees can be obtained. FIG. 8 shows the relation between the weight represented by the position control signal and the clock signal generated by the weighted average process. The first and the second phase interpolators 29*a* and 29*b* can be digitally controlled by the position control signal (weight) to vary the phases of the first and the second clock signals CKI and CKQ, which are thereby adjustable in those 45-degree regions respectively defined by the boundaries B1 and B2 and by the boundaries B3 and B4 selected by the base selector 28. It should be noted that the weight values of 0.75, 0.5 and 0.25 set forth here are for illustrative purpose only.

Figure 9:
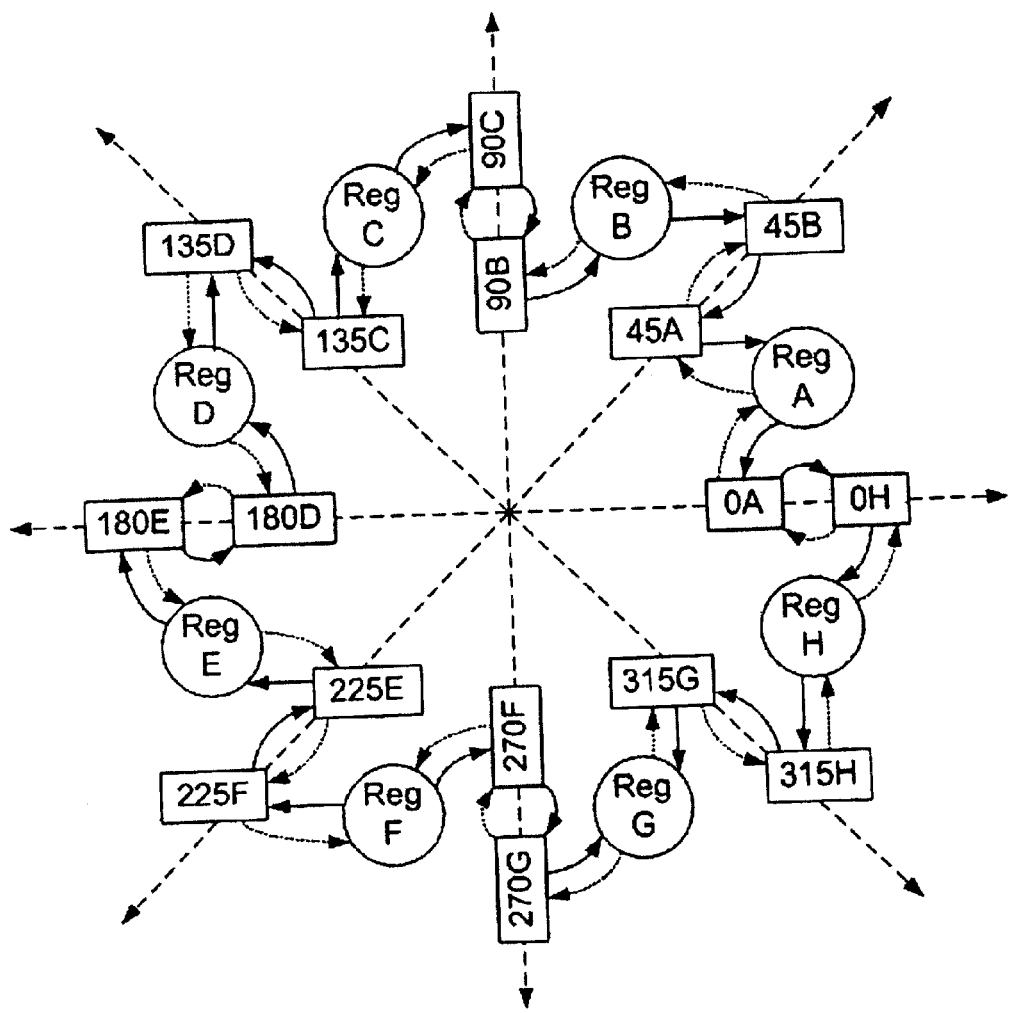
FIG. 9 depicts a phase rotation state machine for the quadrature clock signals.

The phase control of the first and the second clock signals generated by the quadrature phase generator 23 is now explained more specifically with reference to FIG. 9. FIG. 9 shows a phase rotation state machine for the first and the second clock signals CKI and CKQ, in which the clockwise rotation path is represented by solid arrows while the counterclockwise rotation path is represented by dotted arrows. According to the quadrature phase generator 23 of the invention, for each of the phase values falling in any regions other than the boundaries, there is only one setting. However, for each of the phase values falling exactly on the boundaries, there are dual settings. For example, to generate a first clock signal CKI with a 0-degree phase, 0-degree and 45-degree signals may be selected respectively for the first and the second base clock signals B1 and B2 as the phase region boundaries, and the weight is set to 1 (state "0A" in FIG. 9). Alternatively, 0-degree and 315-degree signals may be selected respectively for the first and the second base clock signals B1 and B2 as the phase region boundaries, and the weight is set to 1 (state "0H" in FIG. 9). Accordingly, the setting of a phase value falling on the boundary depends on the previous steady state of the clock signal. Taking the above 0-degree phase setting as an example, if the previous steady state of the first clock signal CKI falls in region A, then the setting of "0A" is adopted; contrarily, if the previous steady state of the first clock signal CKI falls in region H, then the setting of "0H" is adopted. In some situations, it takes a two-step setting for the phase of a clock signal to rotate out of a boundary. For example, if the present state of the first clock signal CKI is "0A", then only one step is needed for the phase to rotate from the boundary to region A; however, if the present state of the first clock signal CKI is "0H", then two steps are needed for the phase to first pass through a transient state "0A" and subsequently proceed to region A. All rotations across two adjacent regions require passing through a transient state. FIG. 10 shows a table for illustrating how the region control signal CA~CF and the position control signal (weight) vary to make the phase rotate, taking the clockwise rotation from region A to region H as an example.

With the above structure, the quadrature phase generator according to the invention can be digitally controlled to generate two adjustable quadrature clock signals, the phases of which are allowed to be adjusted thought the whole cycle While the present invention has been described with reference to the preferred embodiments thereof, it is to be understood that the invention should not be considered as limited thereby. Various modifications and changes could be conceived of by those skilled in the art without departuring from the scope of the present invention, which is indicated by the appended claims.

What is claimed is:

1. An apparatus for generating quadrature phase signals, comprising:

a base selector having a control input terminal for receiving a region control signal, a plurality of reference clock input terminals respectively for receiving a plurality of reference clock signals of the same frequency and different phases, and four base clock output terminals for outputting a first, a second, a third and a fourth base clock signals, said first, said second, said third and said fourth base clock signals being generated in accordance with said region control signal by using said plurality of reference clock signals, a phase difference between said first and said second base clock signals being substantially equal to a phase difference between said third and said fourth base clock signals, a phase difference between said first and said third base clock signals being substantially 90 degrees, a phase difference between said second and said fourth base clock signals being substantially 90 degrees;

a first phase interpolator having a control input terminal, two phase input terminals for respectively receiving said first and said second base clock signals, and a first output terminal, said first phase interpolator generating a first clock signal at said first output terminal in accordance with a position control signal at said control input terminal, said first clock signal having a frequency equal to the frequency of said first and said second base clock signals and having a phase being a weighted average of the phases of said first and said second base clock signals; and a second phase interpolator having a control input terminal, two phase input terminals for respectively receiving said third and said fourth base clock signals, and a second output terminal, said second phase interpolator generating a second clock signal at said second output terminal in accordance with a position control signal at said control input terminal, said second clock signal having a frequency equal to the frequency of said third and said fourth base clock signals and having a phase being a weighted average of the phases of said third and said fourth base clock signals, said first and said second clock signals being substantially 90 degrees out of phase with each other.

2. The apparatus for generating quadrature phase signals of claim 1, wherein said first, said second, said third and said fourth base clock signals are generated by selecting four signals from said plurality of reference clock signals and their inverted signals.

3. The apparatus for generating quadrature phase signals of claim 1, wherein said base selector has four reference clock input terminals for receiving four reference clock signals, the phases of said four reference clock signals and their inverted signals are offset from one another by 45 degrees, and said first, said second, said third and said fourth base clock signals are generated by selecting four signals from said four reference clock signals and their inverted signals.

4. The apparatus for generating quadrature phase signals of claim 3, wherein the phase difference between said first and said second base clock signals is substantially 45 degrees and the phase difference between said third and said fourth base clock signals is substantially 45 degrees.

5. An apparatus for generating quadrature phase signals, comprising:

a base selector, comprising:

a buffer/inverter unit having four input terminals, four corresponding control terminals and four corresponding output terminals, said buffer/inverter unit receiving a first, a second, a third and a fourth reference clock signals of the same frequency and different phases respectively at said four input terminals and outputting four signals selected from said first, said second, said third and said fourth reference clock signals and their inverted signals respectively at said four corresponding output terminals based on control signals at said four corresponding control terminals; and a bypass/cross unit including a first and a second bypass/cross multiplexers, each of said multiplexers having two input terminals, two output terminals and a control terminal, said first bypass/cross multiplexer having its two input terminals connected to two of said four output terminals of said buffer/inverter unit and outputting a first and a third base clock signals by either direct-connecting or cross-connecting signals at its two input terminals to its two output terminals in accordance with a control signal at its control terminal, said second bypass/cross multiplexer having its two input terminals connected to the other two of said four output terminals of said buffer/inverter unit and outputting a second and a fourth base clock signals by either direct-connecting or cross-connecting signals at its two input terminals to its two output terminals in accordance with a control signal at its control terminal, a phase difference between said first and said second base clock signals being substantially equal to a phase difference between said third and said fourth base clock signals, a phase difference between said first and said third base clock signals being substantially 90 degrees, a phase difference between said second and said fourth base clock signals being substantially 90 degrees;

a first phase interpolator having a control input terminal, two phase input terminals for respectively receiving said first and said second base clock signals, and a first output terminal, said first phase interpolator generating a first clock signal at said first output terminal in accordance with a position control signal at said control input terminal, said first clock signal having a frequency equal to the frequency of said first and said second base clock signals and having a phase being a weighted average of the phases of said first and said second base clock signals; and a second phase interpolator having a control input terminal, two phase input terminals for respectively receiving said third and said fourth base clock signals, and a second output terminal, said second phase interpolator generating a second clock signal at said second output terminal in accordance with a position control signal at said control input terminal, said second clock signal having a frequency equal to the frequency of said third and said fourth base clock signals and having a phase being a weighted average of the phases of said third and said fourth base clock signals, said first and said second clock signals being substantially 90 degrees out of phase with each other.

6. The apparatus for generating quadrature phase signals of claim 5, wherein said buffer/inverter unit of said base selector comprises a plurality of XOR (Exclusive-Or) gates.

7. The apparatus for generating quadrature phase signals of claim 6, wherein said buffer/inverter unit of said base selector comprises four XOR (Exclusive-Or) gates, each having two input terminals, respectively used as one of said four input terminals of said buffer/inverter unit for receiving one of said reference clock signals and as one of said four corresponding control terminals of said buffer/inverter unit for receiving one of said corresponding control signals.

8. The apparatus for generating quadrature phase signals of claim 5, wherein the phases of said first, said second, said third and said fourth reference clock signals and their inverted signals are offset from one another by 45 degrees.

9. The apparatus for generating quadrature phase signals of claim 8, wherein the phase difference between said first and said second base clock signals is 45 degrees and the phase difference between said third and said fourth base clock signals is 45 degrees.

10. A data recovery circuit, comprising:

a phase detector receiving an incoming data signal and a first and a second clock signals, said first and said second clock signals having a frequency equal to half the frequency of said incoming data signal and being substantially 90 degrees out of phase with each other, said phase detector comparing the phase of said incoming data signal with the phase of said second clock signal and accordingly generating a phase error signal if a phase difference exists between said incoming data signal and said second clock signal while generating an output data signal recovered from said incoming data signal with said first clock signal if no phase difference exists between said incoming data signal and said second clock signal;

a loop filter receiving said phase error signal from said phase detector and accordingly generating a region control signal and a position control signal for adjusting the phases of said first and said second clock signals;

a multiphase clock source for generating a plurality of reference clock signals of the same frequency and different phases from an external clock signal; and a quadrature phase generator receiving said region control signal and said position control signal from said loop filter and said plurality of reference clock signals from said multiphase source and generating said first and said second clock signals for outputting to said phase detector, said quadrature phase generator comprising:

a base selector for generating a first, a second, a third and a fourth base clock signals in accordance with said region control signal by using said plurality of reference clock signals, a phase difference between said first and said second base clock signals being substantially equal to a phase difference between said third and said fourth base clock signals, a phase difference between said first and said third base clock signals being substantially 90 degrees, a phase difference between said second and said fourth base clock signals being substantially 90 degrees;

a first phase interpolator receiving said first and said second base clock signals and generating a first clock signal in accordance with said position control signal, said first clock signal having a phase being a weighted average of the phases of said first and said second base signals; and a second phase interpolator receiving said third and said fourth base clock signals and generating a second clock signal in accordance with said position control signal, said second clock signal having a phase being a weighted average of the phases of said third and said fourth base signals.

11. A data recovery circuit, comprising:

a phase detector receiving an incoming data signal and a first and a second clock signals, said first and said second clock signals having a frequency equal to half the frequency of said incoming data signal and being substantially 90 degrees out of phase with each other, said phase detector comparing the phase of said incoming data signal with the phase of said second clock signal and accordingly generating a phase error signal if a phase difference exists between said incoming data signal and said second clock signal while generating an output data signal recovered from said incoming data signal with said first clock signal if no phase difference exists between said incoming data signal and said second clock signal;

a loop filter receiving said phase error signal from said phase detector and accordingly generating a region control signal and a position control signal for adjusting the phases of said first and said second clock signals;

a multiphase clock source for generating a first, a second, a third and a fourth reference clock signals of the same frequency and different phases from an external clock signal; and a quadrature phase generator receiving said region control signal and said position control signal from said loop filter and said four reference clock signals from said multiphase source and generating said first and said second clock signals for outputting to said phase detector, said quadrature phase generator comprising:

a base selector, comprising:

a buffer/inverter unit receiving said four reference clock signals and selectively outputting four signals selected from said first, said second, said third and said fourth reference clock signals and their inverted signals respectively at its four output terminals in accordance with said region control signal; and a first and a second bypass/cross multiplexers, said first bypass/cross multiplexer generating a first and a third base clock signals by either direct-outputting or cross-outputting signals at two of the four output terminals of said buffer/inverter unit in accordance with said region control signal, said second bypass/cross multiplexer generating a second and a fourth base clock signals by either direct-outputting or cross-outputting signals at the other two of the four output terminals of said buffer/inverter unit in accordance with said region control signal, a phase difference between said first and said second base clock signals being substantially equal to a phase difference between said third and said fourth base clock signals, a phase difference between said first and said third base clock signals being substantially 90 degrees, a phase difference between said second and said fourth base clock signals being substantially 90 degrees;

a first phase interpolator receiving said first and said second base clock signals and generating a first clock signal in accordance with said position control signal, said first clock signal having a phase being a weighted average of the phases of said first and said second base signals; and a second phase interpolator receiving said third and said fourth base clock signals and generating a second clock signal in accordance with said position control signal, said second clock signal having a phase being a weighted average of the phases of said third and said fourth base signals.

12. The data recovery circuit of claim 11, wherein said buffer/inverter unit of said base selector comprises four XOR (Exclusive-Or) gates, each having two input terminals respectively for receiving one of said reference clock signals and for receiving one bit of said region control signal.

13. The data recovery circuit of claim 11, wherein the phases of said first, said second, said third and said fourth reference clock signals and their inverted signals are offset from one another by 45 degrees.

14. The data recovery circuit of claim 13, wherein the phase difference between said first and said second base clock signals is substantially 45 degrees and the phase difference between said third and said fourth base clock signals is substantially 45 degrees.

* * * * *